United States Patent [19]

Tomioka et al.

[11] Patent Number: 5,397,373
[45] Date of Patent: Mar. 14, 1995

[54] RAW MATERIAL FOR HIGH OXYGEN CHROMIUM TARGET

[75] Inventors: Hidenori Tomioka, Tsukuba; Kenichi Kobayashi; Manabu Takahashi, both of Nishiokitama; Tatsuhiko Fujinuma, Ichikawa, all of Japan

[73] Assignee: Japan Metals & Chemicals Co., Ltd., Tokyo, Japan

[21] Appl. No.: 73,711

[22] Filed: Jun. 9, 1993

[51] Int. Cl.6 .............................................. C22C 29/12
[52] U.S. Cl. .................................. 75/232; 75/245
[58] Field of Search ................................ 75/232, 245

[56] References Cited

U.S. PATENT DOCUMENTS 4,917,722 4/1990 Kuniya et al. ...................... 75/232

FOREIGN PATENT DOCUMENTS 4-48868 2/1918 Japan .

Primary Examiner—Donald P. Walsh
Assistant Examiner—Ngoclan T. Mai
Attorney, Agent, or Firm—Oliff & Berridge

[57] ABSTRACT

A raw material for high oxygen chromium targets comprising chromium crystalline particles dispersed in metallic chromium wherein at least a portion of the surface of all the crystals constituting the oxide crystalline particles is in contact with the matrix of said metallic chromium. And a method of producing a raw material for high oxygen chromium targets comprising chromium oxide crystalline particles dispersed in metallic chromium characterized by heat-treating metallic chromium containing a solid solution of oxygen or oxide particles as a starting material, and precipitating or crystal-growing the oxygen or oxide particles as chromium oxide crystalline particles having a particle size of 0.1 to 100, μm, thereby obtaining a raw material for chromium targets.

2 Claims, 5 Drawing Sheets

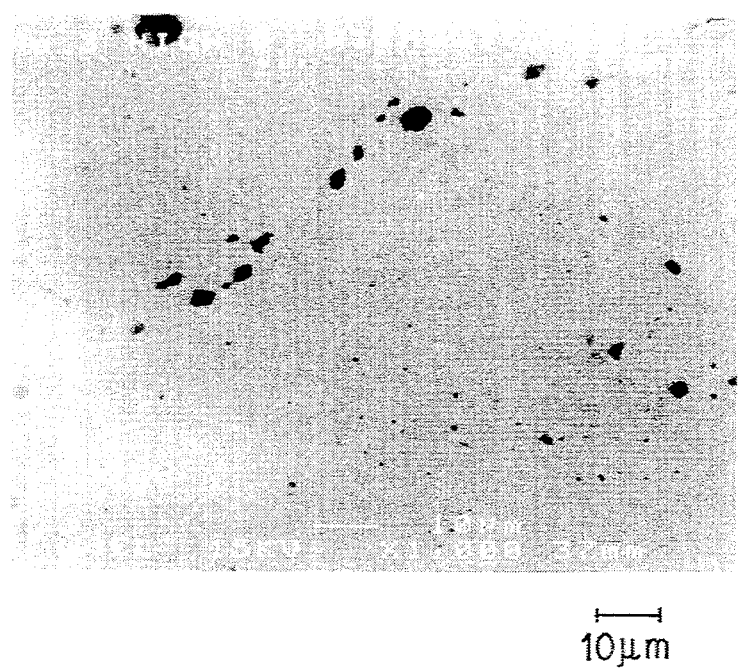
F I G. 1

10μm

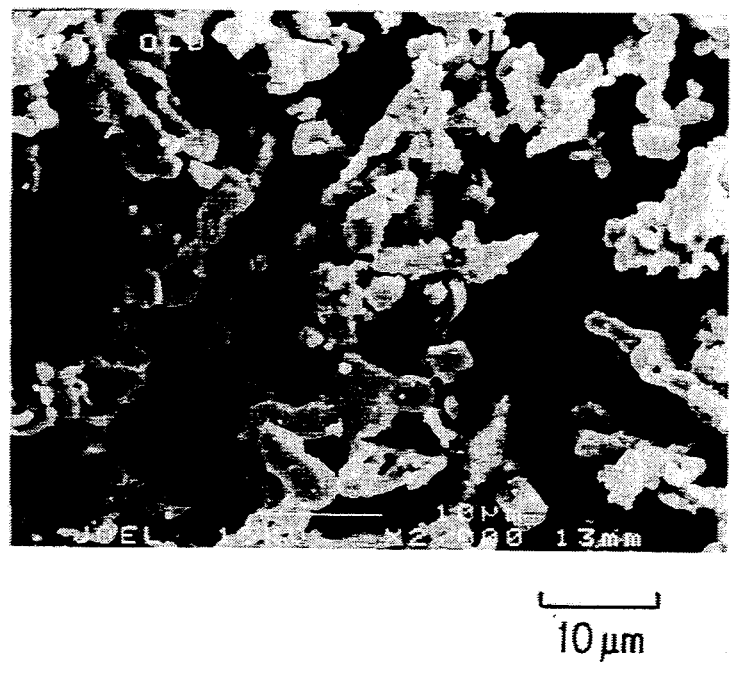
F I G. 5

RAW MATERIAL FOR HIGH OXYGEN CHROMIUM TARGET

BACKGROUND OF THE INVENTION

The present invention relates to a raw material for chromium targets with a high oxygen content and the method of producing thereof, and relates more particularly to a technique which provides a raw material for chromium targets capable of effectively preventing dust generation in forming films by sputtering.

The sputtering method is widely applied to the production of thin film materials in the fields of electronics, optics, precision instruments, cutting tools, etc. This sputtering method comprises colliding argon or other ions against a target obtained by shaping and processing a raw material as a vapor deposition source, and depositing the particles ejected from the target on materials to be vapor coated such as substrates, wafers, etc., thereby forming a thin film.

In recent years, the use of metallic chromium as a raw material for vapor deposition targets produced to apply the base film, etc. of magnetic recording media such as Co-Ni, etc. has been increasing because of the excellent optical properties, electrical properties and corrosion resistance of base films produced with chromium ragets.

Under these circumstances various methods of processing metallic chromium by casting or powder metallurgy are being examined.

As a method of producing metallic chromium by powder metallurgy, the method of pressing high purity metallic chromium powder by the means of hot isostatic pressing (hereinafter referred to as "HIP") etc. are known.

In the Japanese Patent Publication No. 48868/1992, a chromium target material for forming the base film of a magnetic recording medium comprising less than 1,000 ppm of O, less than 300 ppm of N, and the substantial balance of chromium is disclosed, and also in this patent publication disclosure, it is described that a high purity chromium target producted by said powder metallurgy is preferably used.

This prior art is characterized by taking into consideration O and N as impurity elements and controlling the amount of O and N under certain limits, thereby obtaining a high coercive force and a high sputtering speed.

In order to improve the coercive force and the square ratio, as disclosed in said prior art, less impurities are desirable, and therefore it is desired that the contents of the impurities such as O, N, etc. should be minimal.

In order to obtain a magnetic recording medium with a high recording density, less impurity elements are not always desirable, and on the other hand, there are some cases where a higher oxygen content can contribute to an improved recording density.

Under these circumstances, there is a increasing demand for a chromium target with a relatively high oxygen content and for its raw material.

In general, however, the solid solubility limit of O in Cr is extremely low, and it is well known that most of the oxygen is present as chromium oxide ($Cr_2O_3$) in the form of inclusions by adding for example, some thousands of ppm of oxygen to metallic chromium and by having a heat history with temperatures above 800° C.

Therefore, if such an inclusion is present randomly in the target, a local abnormal discharge occurs during film-forming by sputtering, and consequently the inclusions are destroyed, or the problem of the so called "dust ejection" phenomenon arises wherein the inclusions are separated from the target and float in the film-forming chamber.

Such dust ejection is most undesirable for improving the recording density of the magnetic material, because the floating dusts are taken in the film, or they adhere to the film, thereby forming projections. Especially, with the increasing recording density of the magnetic medium, there is a tendency toward a higher possibility of a fatal fault, the so-called head crash, wherein said projections on the magnetic film crash against the magnetic head when the flying height of the head is lower than 1 $\mu m$.

It is therefore the object of the present invention to improve the oxygen containing form of the metallic chromium used for chromium targets and specifically to obtain a structure incongruous with dust generation from the target in forming a thin film of the target material on the substrate of the recording medium, and to provide a raw material (sintered compact or powder) for chromium targets capable of improving the recording density.

As a result of having concentrated their energies to accomplish said object, the inventors invented the present invention whose outline is as follows:

Namely, the present invention relates to a raw material for high oxygen chromium targets comprising chromium oxide crystalline particles dispersed almost uniformly in metallic chromium with at least a portion of the surface of all the crystals constituting the oxide crystalline particle being in contact with said metallic chromium.

According to the present invention, said chromium oxide crystalline particles have a particles size of 0.1 to 100 $\mu m$, and preferably of 0.1 to 20 $\mu m$.

And the method of producing a raw material for high oxygen chromium targets according to the present invention comprising chromium oxide crystalline particles dispersed in metallic chromium is characterized by heat-treating metallic chromium containing a solid solution of oxygen or oxide particles as a starting material, and by precipitating or crystal-growing its oxygen or oxide particles as chromium oxide crystalline particles having a particle size of 0.1 to 100 $\mu m$, thereby obtaining a raw material for chromium targets And another method of producing a raw material for high oxygen chromium targets according to the present invention comprising chromium oxide crystalline particles dispersed in metallic chromium is characterized by mixing metallic chromium powder containing a solid solution of oxygen or oxide particles with chromium oxide powder, then heat-treating the mixed powder, and by precipitating and crystal-growing the oxygen, oxide particles and oxide powder as chromium oxide crystalline particles having a particle size of 0.1 to 100 $\mu m$, thereby obtaining a raw material for chromium targets And said heat-treating can be performed during or after the process in which metallic chromium or a mixed powder of metallic chromium powder and chromium oxide powder is compacted into a predetermined form by means of a hot isostatic press.

SUMMARY OF THE INVENTION

The raw material for targets according to the present invention is characterized by comprising chromium oxide crystalline particles dispersed in metallic chromium with at least a part of the surface of all the crystals constituting the oxide crystalline particles being in contact with said metallic chromium. Because the oxide is dispersed almost uniformly in the metallic chromium as a result thereof, the dust ejection phenomenon associated with the oxide can be effectively prevented during film deposition vapor-depositing the chromium on the substrate by sputtering, and thereby forming a thin film, and a high density magnetic material with very little head crash can be obtained.

According to the present invention, the chromium oxide crystalline particles include the ones containing one or both of the chromium oxide crystals whose solid solved oxygen is precipitated and the chromium oxide particled which are crystal-grown.

It is also necessary that at least a part of the surface of all the crystals constituting these chromium oxide crystalline particles are in contact with said metallic chromium matrix, and it is therefore desirable that monocrystals are linked to each other like a chain or two-dimensionally.

In the raw material for chromium targets according to the present invention, said chromium oxide crystalline particles are dispersed with their surface being in contact with the metallic chromium matrix, but because the powdered metallic chromium after sintering is fragile in the grain boundary containing said chromium oxide crystalline particles, there are cases where said chromium oxide crystalline particles are detached from the metallic chromium matrix.

According to the present invention, said effects of the present invention are also exhibited sufficiently in these cases.

BRIEF DESCRIPTION OF THE DRAWINGS

FIG. 1 is a SEM-photograph showing the particle structure of the sintered raw material for the target described in Example 1.

FIG. 5 is a SEM-photograph showing the particle structure of the $Cr_2O_3$ extracted from the sintered raw material for the target described in Example 2 by means of solution extract method.

DESCRIPTION OF THE PREFERRED EMBODIMENTS

Figure 2:
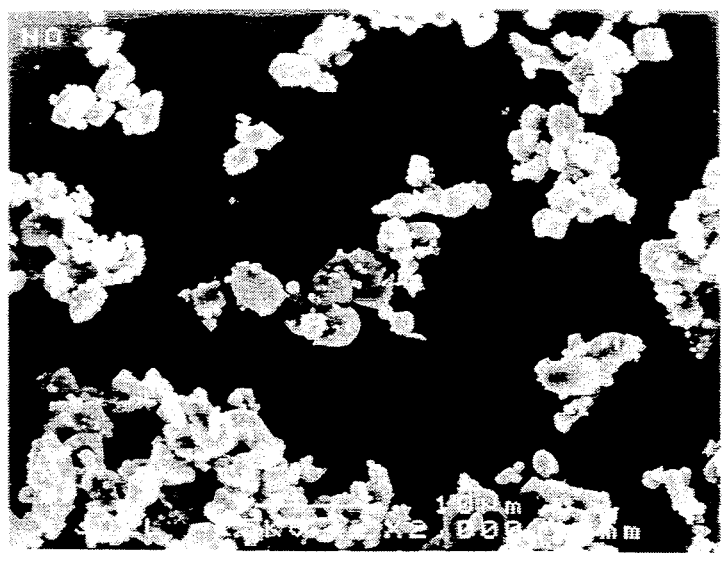
FIG. 2 is a SEM-photograph showing the particle structure of the $Cr_2O_3$ extracted from the sintered raw material for the target described in Example 1 by means of solution extract method.

Such chromium oxide crystalline particles shall have a particle size of 0.1 to 100 μm, and preferably of 0.1 to 20 μm are easy to crack. As particles with a size of over 100 μm, and the dust ejection phenomenon may be caused by the cracked particles.

According to the present invention, said chromium oxide crystalline particles are obtained by heat-treating metallic chromium containing solid dissolved oxygen or oxide particles, or the mixture of said metallic chromium powder and chromium oxide powder, and precipitating or crystal-growing the metallic chromium or the mixture to achieve chromium oxide crystalline particles with a size of 0.1 to 100 μm, and preferably to 0.1 to 20 μm.

The reason why the solid dissolved oxygen or oxide particles are precipitated or crystal-grown by heat treatment is that a raw material for chromium targets in which chromium oxide crystalline particles forming no three-dimensional agglomerates are dispersed uniformly and exhibit a uniform size can be obtained with ease and certainty.

According to the present invention oxide particles contained in metallic chromium as a starting material, or chromium oxide powder, have preferably a particle size of not more than 5 μm because it is difficult to control the particle size after crystal growth to less than 100 μm when the oxide particles, or the chromium oxide powder, have a particle size of more than 5 μm.

A method of producing a raw material for high oxygen chromium targets comprising chromium oxide crystalline particles dispersed in metallic chromium according to the present invention is characterized by heat-treating metallic chromium containing a solid solution of oxygen or oxide particles, or said metallic chromium powder mixed with chromium oxide powder such as $Cr_2O_3$ and $Cr_2O_5$ etc. as a starting material, and precipitating or crystal-growing its oxygen or oxide particles as chromium oxide crystalline particles having a particle size of 0.1 to 100 μm, thereby obtaining a raw material for chromium targets.

It is desirable that said heat treatment is performed in an atmosphere of 800° to 1,500° C. in which no extreme oxidation or reduction takes place, and preferably in vacuum or in an inert gaseous atmosphere.

Said effects of the present invention are exhibited sufficiently when said heat treatment is performed during HIP-processing to compact into a predetermined form, or also before or after said HIP-processing.

However, because there is a possibility that the chromium particles in the matrix become coarse when heat treatment is performed during or after HIP-processing, it is desirable that heat treatment is performed before the atmosphere is maintained at a predetermined pressure as in HIP-processing, when the grain size of the chromium matrix must be controlled.

According to the present invention, said heat treatment can be combined with other heat treatment such as desulfurization.

According to the present invention, high oxygen means an oxygen concentration of about 1,000 to 10,000 ppm.

And according to the present invention, metallic chromium of any production method such the electrolytic method, thermite method, etc. can be used as long as the metallic chromium satisfies the purity required for targets. Therefore, the effects of the present invention are exhibited sufficiently even if a mixture metallic chromium from various production methods are mixed with each other.

Moreover, according to the present invention, elements other than oxygen and chromium can be added corresponding to objects unless a extreme oxidation or reduction reaction takes place.

The raw material for chromium targets according to the present invention is provided in the form of sintered compact or powder. The sintered compact is provided as it is, or after being powdered and compacted into a predetermined form by means of HIP-processing. On the other hand, the powder is provided after being compacted into a predetermined form by means of HIP-processing.

This raw material for chromium target can be used also in casting.

EXAMPLE 1

Metallic chromium with a metallic content purity of 99.8% and an oxygen content of about 5,000 ppm produced by an electrolytic method (sample No. 1: chemical analysis values are shown in Table 1) was powdered, the metallic chromium powder passing through a sieve of 48 mesh was mixed with a small amount of desulfurizing agent and a binder, the mixture was agglomerated, dried sufficiently, and heat-treated in a vacuum of not more than 1 Torr at a temperature of 1,000° C. above for 8 hours, thereby obtaining a raw material for chromium targets.

In order to determine the form of the oxygen in the thus obtained sintered raw material for chromium targets, the reflected electronic image of the cross section thereof obtained was observed by means of a scanning electron microscope (SEM). The electron image is shown in FIG. 1.

As seen from the photograph shown in FIG. 1, it was confirmed that inclusions of 0.1 to 5 μm in size (the part indicated with the sign (a) which is darker than the surroundings) were precipitated in the grain boundaries or in the grains which seemingly reflected the original chromium powder starting material. As a result of X-ray diffraction of inclusions extracted by a solution extract method with chlorine these inclusions were identified as $Cr_2O_3$.

FIG. 1 shows only a part of the visual field of the SEM-observation, but in any other part of the visual field the same observation results were obtained. It was therefore confirmed that the $Cr_2O_3$ grains were dispersed very uniformly in a macroscopic field.

FIG. 2 is a photograph showing the observation result of the SEM-secondary electron image of the $Cr_2O_3$ grains and inclusions extracted by a solution extract method. As seen from this photograph, it was confirmed that the $Cr_2O_3$ grains had a particle size of 0.1 to 5 μm, and each crystalline particle formed no three dimensional agglomerate.

Then, after powdering such a raw material for chromium targets according to the present invention, and compacting it by means of HIP-processing, film deposition was performed by means of sputtering using the target processed in a predetermined form. As a result thereof, it was confirmed that minimal dust was generated.

EXAMPLE 2

Metallic chromium with a metallic content purity of 99.9% produced by an electrolytic method (sample No. 2: chemical analysis values are shown in Table 1) was powdered, 100 parts by weight of the metallic chromium powder was passed through a sieve of 48 mesh, 0.7 parts by weight of $Cr_2O_3$ powder as an oxygen addition agent was added, and the mixture was agglomerated with a small amount of desulfurizing agent and a binder, dried sufficiently, and heat-treated under the same conditions as in Example 1, thereby obtaining a raw material for chromium targets.

Figure 3:
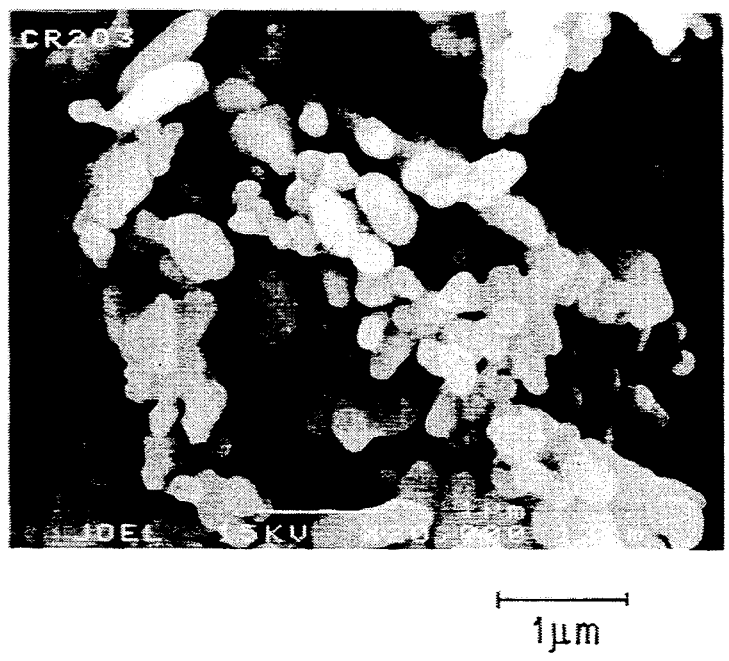
FIG. 3 is a SEM-photograph showing the particle structure of the $Cr_2O_3$ powder used in Example 2.

The observation result of the SEM-secondary electron image of said added $Cr_2O_3$ powder is shown in FIG. 3. As seen from the photograph shown in this FIG., it was confirmed that the primary grains were very fine and their particle size was about 0.4 μm. Moreover, said powder had agglomerated during the production process, and as a result of the powder size analysis, it was confirmed that said powder had formed agglomerates of several μm to 100 μm in size.

In order to confirm the oxygen containing form of the thus obtained sintered raw material for chromium targets, the reflected electron image of the cross section thereof obtained by means of a scanning electron microscope (SEM) was observed. The electron image is shown in FIG. 4.

Figure 4:
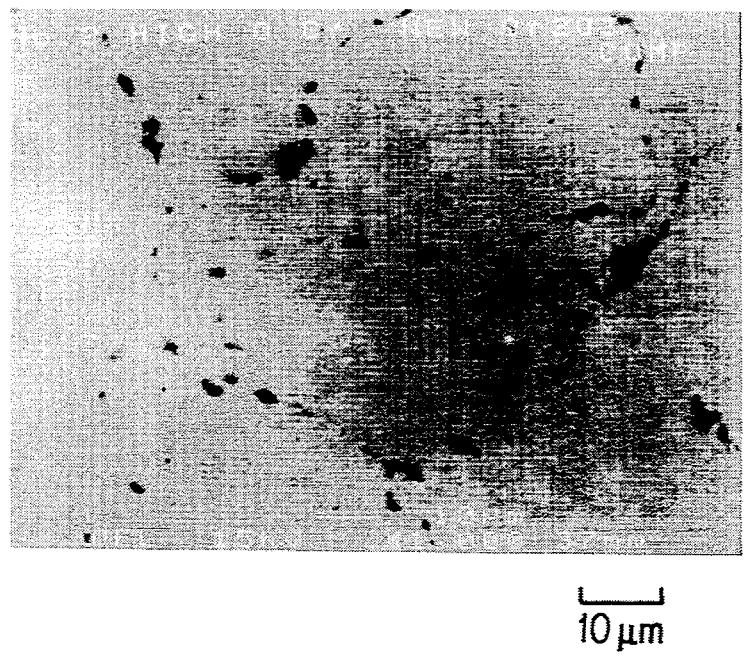
FIG. 4 is a SEM-photograph showing the particle structure of the sintered raw material for the target described in Example 2.

As seen from the photograph shown in FIG. 4, it was confirmed that the inclusions of 0.1 to 5 μm in size (the part indicated with the sign (1) which is darker than the surroundings) were precipitated in the grain boundaries of the crystalline particles or in the grains which seemingly reflected the original chromium powder starting material. As a result of X-ray diffraction of inclusions extracted by a solution extract method with chlorine, these inclusions were indentified as $Cr_2O_3$ as in Example 1.

FIG. 4 shows only a part of the visual field of the SEM-observation, but in any other part of the visual field the same observation results were obtained. It was therefore confirmed as in Example 1 that the $Cr_2O_3$ grains were dispersed very uniformly in a macroscope field.

FIG. 5 is a photograph showing the observation result of the SEM secondary electron image of the $Cr_2O_3$, inclusions extracted by a solution extract method. As seen from this photograph, it was confirmed that the $Cr_2O_3$ particles have a particle size of 0.1 to 5 μm, and each crystalline particle was linked two-dimensionally like a chain and formed no three-dimensional agglomerate.

Then, after powdering such a raw material for chromium targets according to the present invention, and compacting it by means of HIP-processing, film deposition was performed by means of sputtering using the target processed in a predetermined form. As result thereof it was confirmed as in Example 1 that minimal dust was generated.

EXAMPLE 3

Metallic chromium with a metallic content purity of 99.8% and an oxygen content of about 5,000 ppm produced by an electrolytic method (sample No. 1: chemical analysis values are shown in Table 1) was powdered, and the metallic chromium powder passing through a sieve of 48 mesh was processed by means of HIP-processing under predetermined conditions and then heat-treated as in Example 1. The form of oxygen contained in compact obtained by said treatment was observed and analyzed, and consequently it was confirmed as in Example 1 that the $Cr_2O_3$ particles were dispersed uniformly in the metallic chromium and formed no three-dimensional agglomerates.

Then, film deposition was performed by means of sputtering using a target processed in a predetermined from. As a result thereof it was confirmed as in Example 1 that minimal dust was generated.

TABLE 1

| Metallic Cr | Fe | Si | Al | O | N | C | S | (ppm) Cr |
| --- | --- | --- | --- | --- | --- | --- | --- | --- |
| Sample No. 1 | 600 | 10 | 10 | 4830 | 200 | 40 | 220 | rest |
| Sample No. 2 | 22 | 10 | 20 | 3000 | 50 | 50 | 220 | rest |

As described above, according to the present invention a raw material for high oxygen chromium targets containing oxygen in a form capable of effectively by sputtering can be provided efficiently and with certainly by means of an easy method of heat treatment.

This raw material makes it possible to form a smooth oxygen containing chromium film with a smooth surface without projections, and the recording density of the magnetic material can be improved.

What is claimed is:

1. A raw material for high oxygen chromium targets comprising chromium oxide crystalline particles dispersed in metallic chromium with at least a portion of the surface of all the crystals constituting the oxide crystalline particles being in contact with the matrix of said metallic chromium.

2. The raw material for high oxygen chromium targets described in claim 1 wherein said chromium oxide crystalline particles range in size from 0.1 to 100 $\mu$m.